US008622752B2

(12) United States Patent
Parrish et al.

(10) Patent No.: US 8,622,752 B2
(45) Date of Patent: Jan. 7, 2014

(54) PROBE-CARD INTERPOSER CONSTRUCTED USING HEXAGONAL MODULES

(75) Inventors: Frank B. Parrish, Simi Valley, CA (US); Josh M. Mellinger, Newbury Park, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 13/085,885

(22) Filed: Apr. 13, 2011

(65) Prior Publication Data

US 2012/0264320 A1 Oct. 18, 2012

(51) Int. Cl.
*H01R 12/00* (2006.01)

(52) U.S. Cl.
USPC .......................................................... 439/66

(58) Field of Classification Search
USPC .............. 439/66, 91, 249; 324/755.1, 755.08, 324/755.11
See application file for complete search history.

(56) References Cited

U.S. PATENT DOCUMENTS

| 1,872,678 | A | * | 8/1932 | Chamberlain | ................. | 439/696 |
| 4,180,304 | A | * | 12/1979 | Lerude | ......................... | 439/76.1 |
| 4,626,775 | A | * | 12/1986 | Cho et al. | ....................... | 324/73.1 |
| 5,068,602 | A | * | 11/1991 | Mielke | ....................... | 324/756.04 |
| 5,087,877 | A | * | 2/1992 | Frentz et al. | ............. | 324/750.25 |
| 5,267,867 | A | * | 12/1993 | Agahdel et al. | ................ | 439/73 |
| 5,500,540 | A | * | 3/1996 | Jewell et al. | ..................... | 257/82 |
| 6,051,982 | A | * | 4/2000 | Alcoe et al. | ............... | 324/750.16 |
| 6,083,025 | A | * | 7/2000 | Anbo et al. | ................... | 439/310 |
| 6,215,320 | B1 | * | 4/2001 | Parrish | ..................... | 324/756.03 |
| 6,354,844 | B1 | * | 3/2002 | Coico et al. | ..................... | 439/66 |
| 6,359,236 | B1 | * | 3/2002 | DiStefano et al. | ............ | 174/261 |
| 6,529,022 | B2 | * | 3/2003 | Pierce | ...................... | 324/750.25 |
| 6,594,811 | B2 | * | 7/2003 | Katz | ............................. | 257/695 |
| 6,624,648 | B2 | * | 9/2003 | Eldridge et al. | ......... | 324/756.03 |
| 6,690,185 | B1 | * | 2/2004 | Khandros et al. | ........ | 324/756.03 |
| 6,711,026 | B2 | * | 3/2004 | Hoffmeyer | ..................... | 361/778 |
| 6,741,085 | B1 | * | 5/2004 | Khandros et al. | ........ | 324/750.22 |
| 6,759,741 | B2 | * | 7/2004 | Kline | ............................. | 257/727 |
| 6,865,140 | B2 | * | 3/2005 | Thomenius et al. | .......... | 367/155 |

(Continued)

FOREIGN PATENT DOCUMENTS

JP 2006-349692 12/2006

OTHER PUBLICATIONS

International Search Report and Written Opinion for International Application No. PCT/2012/027276 mailed Sep. 20, 2012.

*Primary Examiner* — Amy Cohen Johnson
*Assistant Examiner* — Vladimir Imas
(74) *Attorney, Agent, or Firm* — Wolf, Greenfield & Sacks, P.C.

(57) ABSTRACT

Apparatus and methods for fabricating an interposer that may be used in testing a large number of electronic circuits or devices in parallel. The interposer may be fabricated from a plurality of modules that may be assembled into a selected shape, such that the assembled modules substantially fill the selected shape, e.g., a circle approximately the size of a semiconductor wafer. The plurality of modules may be formed from a single base shape (e.g., formed from a single injection mold). A portion of the formed modules may be machined into a first machined shape, or first and second machined shapes. The assembled modules may include only the base shape and first machined shape or first and second machined shapes. The limited number of shapes can reduce fabrication costs for an interposer.

35 Claims, 4 Drawing Sheets

(56) References Cited

U.S. PATENT DOCUMENTS

| | | | |
|---|---|---|---|
| 6,907,658 B2* | 6/2005 | Li | 29/832 |
| 6,946,859 B2* | 9/2005 | Karavakis et al. | 324/754.18 |
| 7,079,398 B2* | 7/2006 | Hoffmeyer | 361/772 |
| 7,108,546 B2* | 9/2006 | Miller et al. | 439/578 |
| 7,140,883 B2* | 11/2006 | Khandros et al. | 439/66 |
| 7,257,051 B2* | 8/2007 | Thomenius et al. | 367/153 |
| 7,280,435 B2* | 10/2007 | Thomenius et al. | 367/153 |
| 7,313,053 B2* | 12/2007 | Wodnicki | 367/153 |
| 7,335,057 B2* | 2/2008 | Miller et al. | 439/578 |
| 7,347,702 B2* | 3/2008 | Eldridge et al. | 439/81 |
| 7,353,056 B2* | 4/2008 | Hazard et al. | 600/407 |
| 7,403,025 B2* | 7/2008 | Tervo et al. | 324/755.09 |
| 7,408,283 B2* | 8/2008 | Smith et al. | 310/309 |
| 7,443,186 B2* | 10/2008 | Strid et al. | 324/750.3 |
| 7,453,277 B2* | 11/2008 | Johnson | 324/750.05 |
| 7,456,643 B2* | 11/2008 | Johnson | 324/756.03 |
| 7,459,924 B2* | 12/2008 | Johnson | 324/757.03 |
| 7,470,232 B2* | 12/2008 | Hoctor et al. | 600/453 |
| 7,473,102 B2* | 1/2009 | Colgan et al. | 439/66 |
| 7,489,148 B2* | 2/2009 | Johnson | 324/754.03 |
| 7,498,800 B1* | 3/2009 | Whiteman | 324/757.03 |
| 7,504,842 B2* | 3/2009 | Schwindt | 324/755.01 |
| 7,511,518 B2* | 3/2009 | Egitto et al. | 324/754.18 |
| 7,532,022 B2* | 5/2009 | Johnson | 324/754.03 |
| 7,572,132 B2* | 8/2009 | Johnson et al. | 439/152 |
| 7,579,852 B2* | 8/2009 | Johnson | 324/757.03 |
| 7,597,561 B2* | 10/2009 | Radza et al. | 439/66 |
| 7,699,616 B2* | 4/2010 | Miller et al. | 439/45 |
| 7,714,598 B2* | 5/2010 | Eldridge et al. | 324/754.14 |
| 7,719,298 B2* | 5/2010 | Johnson | 324/762.05 |
| 7,724,008 B2* | 5/2010 | Johnson | 324/762.05 |
| 7,758,351 B2* | 7/2010 | Brown et al. | 439/66 |
| 7,775,979 B2* | 8/2010 | Thomenius et al. | 600/437 |
| 7,808,259 B2 | 10/2010 | Eldridge et al. | |
| 7,888,957 B2* | 2/2011 | Smith et al. | 324/754.07 |
| 7,960,986 B2* | 6/2011 | Johnson | 324/754.07 |
| 8,011,089 B2* | 9/2011 | Eslamy et al. | 29/842 |
| 8,059,233 B2* | 11/2011 | Ishihara et al. | 349/106 |
| 8,296,614 B2* | 10/2012 | Whetsel | 714/727 |
| 2002/0081869 A1* | 6/2002 | Abbott | 439/66 |
| 2005/0094490 A1* | 5/2005 | Thomenius et al. | 367/155 |
| 2005/0164526 A1* | 7/2005 | Kwark | 439/66 |
| 2006/0087332 A1* | 4/2006 | Drost et al. | 324/754 |
| 2006/0091509 A1* | 5/2006 | Zhao et al. | 257/678 |
| 2006/0091510 A1 | 5/2006 | Liu et al. | |
| 2006/0091542 A1* | 5/2006 | Zhao et al. | 257/738 |
| 2006/0141815 A1* | 6/2006 | Li | 439/66 |
| 2007/0126111 A1* | 6/2007 | Mirsky et al. | 257/700 |
| 2008/0006934 A1* | 1/2008 | Zhao et al. | 257/713 |
| 2008/0150571 A1* | 6/2008 | Miller et al. | 324/765 |
| 2008/0252314 A1* | 10/2008 | Hopkins et al. | 324/754 |
| 2008/0258745 A1* | 10/2008 | Hosaka | 324/754 |
| 2008/0278188 A1* | 11/2008 | Chung | 324/762 |
| 2008/0296697 A1* | 12/2008 | Hsu et al. | 257/379 |
| 2008/0303129 A1* | 12/2008 | Wang et al. | 257/680 |
| 2009/0102500 A1* | 4/2009 | An et al. | 324/761 |
| 2009/0161298 A1* | 6/2009 | Lee et al. | 361/525 |
| 2009/0167335 A1 | 7/2009 | Yamada et al. | |
| 2009/0219042 A1* | 9/2009 | Sasaki et al. | 324/754 |
| 2010/0052714 A1* | 3/2010 | Miller | 324/754 |
| 2010/0141288 A1* | 6/2010 | Di Lello | 324/755 |
| 2010/0237888 A1* | 9/2010 | Desta et al. | 324/757 |
| 2011/0062574 A1* | 3/2011 | Jang et al. | 257/686 |
| 2011/0071397 A1* | 3/2011 | Wodnicki et al. | 600/459 |
| 2011/0073355 A1* | 3/2011 | Tamura | 174/255 |
| 2011/0281377 A1* | 11/2011 | Yamada et al. | 438/10 |
| 2012/0168964 A1* | 7/2012 | Kim | 257/777 |

* cited by examiner

PROBE-CARD INTERPOSER CONSTRUCTED USING HEXAGONAL MODULES

FIELD OF THE INVENTION

Embodiments of the invention relate to probe-card interposers useful for testing a large number of integrated circuits and/or integrated circuit devices in parallel. Apparatus and methods for making probe-card interposers from a limited number of modules derived from a single base shape are disclosed.

BACKGROUND

Probe-card interposers, also referred to herein as "interposers," are used as a component of an electronic testing system, also referred to herein as a "tester." The tester and interposer may be used for electrical testing of integrated circuits and/or integrated circuit devices. In general, the tester may generate a plurality of test signals that are routed through an interposer to specific contact points on integrated circuits or integrated devices. There may be an adapter, also referred to herein as a "translator," between the interposer and circuits or devices under test. The adapter may provide a spatial mapping for signal paths on the interposer to a distribution of probes on the translator that align to the contact points specific to the devices or circuits under test. An interposer can provide a separable connection between the tester and translator, so that different translators may be used on the testing system with different circuit and device layouts.

In semiconductor manufacturing, it is generally economically advantageous to parallelize manufacturing steps for as many devices and/or circuits as possible. Accordingly, a reduction in device size and increase in wafer size beneficially results in a greater number of devices being produced with each manufacturing step. This can, however, place greater demands on the manufacturing equipment. In this regard for a tester, smaller devices can require a higher density of probes and probe circuitry in a fixed area and increase demands on alignment of probes to contact points. Large test areas may require the handling and management of a large number of signals in the tester. Reductions in device size and increase in wafer size can require interposers of larger size capable of handling a large number of test signals from the tester and response signals from the devices and circuits under test.

SUMMARY

The inventors have recognized and appreciated that large interposers for testing large areas may be made with a high density of conductors at low cost compared to conventional approaches. The interposer may comprise modules of a small number of shapes that may be readily assembled into an interposer of a selected shape, e.g., a circle. The inventors have further recognized that the small number of shapes can be fabricated from a base shape and few shapes that are machined from the base shape. The base shape may be injection molded initially, e.g., molded in the shape of a hexagon. In some embodiments, the same base shape may be used for wafers of different sizes.

According to some embodiments of the invention, an interposer comprises a plurality of modules, each module being in a shape selected from the following group: a first shape, a first portion of the first shape, and a second portion of the first shape. The plurality of modules, when assembled into the interposer, may substantially fill a circle circumscribing the interposer. As one example, the first shape may be a hexagon.

In some embodiments, the interposer comprises a plurality of modules or blocks, each module or block being in a shape selected from a first shape or a portion of the first shape. The first shape may be a polygon having more than four sides.

Embodiments also include an interposer block useful for making an interposer. The interposer block may comprise a hexagonally-shaped element comprising a first surface, a second surface, and six edge surfaces. The block may further include at least one alignment feature near a first apex of the hexagonally-shaped element for aligning the block in an interposer comprising a plurality of the hexagonally-shaped elements. The interposer block may further comprise a plurality of conductive structures distributed across the hexagonally-shaped element.

A method for fabricating an interposer, according to one embodiment of the invention, include acts of forming a plurality of modules of a first shape; and machining a portion of the plurality of modules into not more than a second shape and a third shape. Further, the first shape, second shape, and optionally third shape are selected such that modules of the first, second, and optionally third shapes may be assembled to substantially fill a circle circumscribing the assembled modules. All shapes may have common alignment features, e.g., alignment features that are located in a substantially identical arrangement on each piece and at substantially identical locations with respect to a reference location or reference locations common to each piece. The filling of the circle may comprise covering an area of the circle that is greater than 90% in some embodiments, greater than 95% in some embodiments, and yet greater than 98% in some embodiments. In some alternative embodiments, more than three pieces may be used, wherein each piece is derived from a common first shape.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

Figure 1:
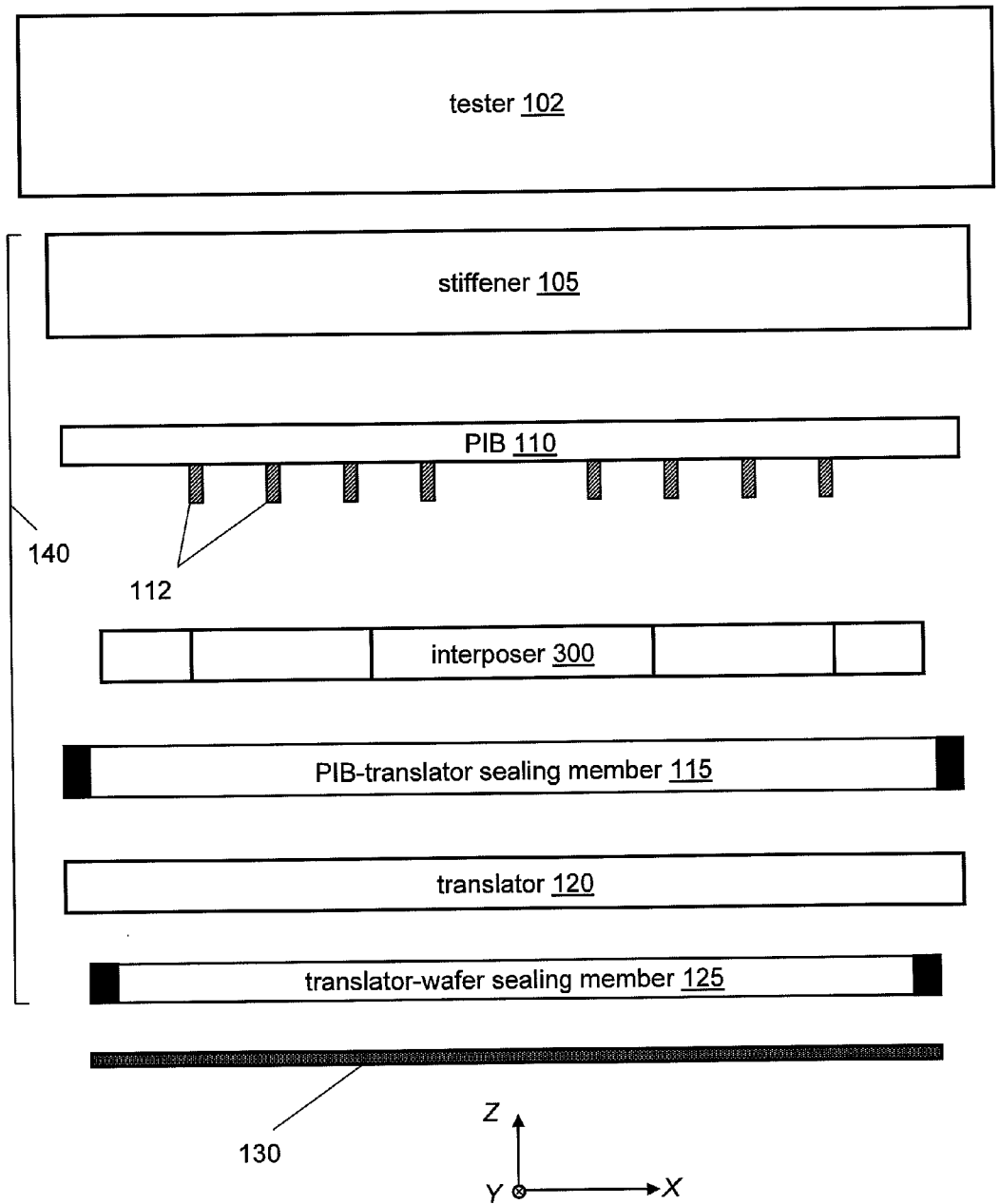
FIG. 1 is a block-diagram representation of components of a testing system according to one embodiment.

The features and advantages of the present invention will become more apparent from the detailed description set forth below when taken in conjunction with the drawings.

DETAILED DESCRIPTION

Interposers, as used in testers, can participate in facilitating massively parallel interconnections between test circuitry in a tester and a large number of devices distributed on a test sample such as a wafer. The inventors have appreciated that design and fabrication of interposers may be labor or cost intensive due to a large number of electrical interconnects at high density that may be required for interposers. As an example, electronic contacts on an interposer may be required to be spaced by about 0.8 millimeter over an area approximately the size of a full wafer having a diameter of about 300 millimeters, and in some cases a diameter up to about 450 mm. The inventors have recognized that the interposer should be adapted for incorporation into a probe assembly that can accommodate a variety of circuit patterns and circuit densities, as well as provide a high number of electrical contacts (e.g., in the tens of thousands) at high density so that full-wafer testing may be performed. The inventors also appreciate that it would be desirable to minimize retooling costs associated with industry changes (e.g., scaling a tester probe assembly due to a change in semiconductor wafer size) or variations in wafer sizes from facility to facility.

In consideration of the foregoing, the inventors have conceived of methods and apparatus for making interposers from a plurality of modules derived from a single module shape. Each module may include a substantially uniform and high density of electrical contacts distributed across substantially all of the module's electrically interconnecting surfaces. The interposer may be scaled in size without substantial redesign, and with modest retooling costs.

In this regard, an interposer may be readily assembled into a selected shape, e.g., a circle approximately the size of a wafer, from modules of a small number of shapes. The modules may include the base shape and few additional shapes that are machined from the base shape. In one embodiment, the small number of modules consists of a base shape, comprising a hexagon, and two additional shapes, each machined portions of the hexagon. The base shape module may be injection molded, so that only one tooling cost for an injection mold is required. Additionally, each module or piece may share alignment features that are substantially identically arranged and located on each piece. The common alignment features provide for use of a single assembly machine when assembling or manufacturing each interposer module. The common alignment features also provide for use of a single test fixture to electrically test each piece.

A large size is selected for each interposer module such that few pieces in total are required for assembly of the interposer. When larger pieces are chosen, there are fewer assembly steps due to a fewer number of pieces, and there are fewer borders between assembled pieces within the area of the assembled interposer. Borders can lead to areas that are not usable for probing underlying devices. Also, fewer pieces result in less tooling for alignment features.

In overview and referring now to FIG. 1, a tester 102 and probe assembly 140 is depicted in block diagram according to one embodiment of the invention. The tester and probe assembly may be used to test, in parallel, a large number of integrated circuits and/or integrated circuit devices (not shown) distributed on a test sample 130, e.g., a wafer containing the circuits and/or devices. The testing may be carried out at frequencies down to about 10 megahertz (MHz) and/or at high frequencies, e.g., frequencies up to 100 MHz in some implementations, frequencies up to one gigahertz (GHz) in some embodiments, and yet frequencies up to tens of GHz in some embodiments. The probe assembly 140 may provide a large number of electrical interconnects that convey test signals from test circuitry (not shown) in the tester 102 to the integrated circuits and/or integrated circuit devices that are located on a test sample 130, e.g., a wafer. The probe assembly 140 may also provide a large number of electrical interconnects that return signals from the integrated circuits and/or integrated circuit devices to test circuitry in the tester 102 for analyses. Analyses of the returned signals may provide a qualitative and/or quantitative determination of operational performance of the integrated circuits and/or integrated circuit devices. In this manner, high frequency, and high parallelism testing and analysis can be carried out over an area that conforms approximately to the size of a wafer.

The tester 102 is shown in block diagram, and may comprise at least one signal generation source, at least one signal detector, and at least one processor for generating or altering at least one generated signal and/or processing at least one detected signal. The tester may include a large number of electrical connection pads or connection pins that may be connected to mating connection structures on the probe assembly 140. Such a tester may be implemented using known techniques and further aspects of the tester need not be described.

The probe assembly 140 facilitates massively parallel interconnection between test circuitry in the tester 102 and a plurality of circuits and/or devices disposed on the test sample 130. The test sample 130 may be a wafer, e.g., a customer's wafer. The probe assembly 140 may comprise a stiffener 105, a probe interface board (PIB) 110, an interposer 300, and a translator 120. In some embodiments, the sealing members 115, 125 may or may not be included with the probe assembly. In some implementations, the member 115 may comprise a stiffening bracket, and may or may not have sealing functionality. The probe assembly 140 may be assembled as a stack when used with the tester 102.

The stiffener 105 may comprise a rigid component to which the PIB 110, interposer 300, and translator 120 may be secured. The stiffener may provide mechanical features for aligning and/or fastening the probe assembly 140 to the tester 102. In some embodiments, the stiffener provides a high degree of flatness as well as rigidity to the probe assembly. The stiffener 105 may comprise a rigid material, e.g., a metal, a ceramic, a glass, a crystalline material, a rigid polymer, a composite, or any combination thereof. The stiffener may be provided to reduce flexibility of the assembled stack, as known in the art or in any other suitable way.

The probe interface board 110 may comprise a printed circuit board with mating electrical connection features that connect to the tester 102. The PIB may include a plurality of electrical traces to route signals from the tester to one or more electrical interconnects on the interposer, and to route signals from the interposer to one or more signal detection channels in the tester 102. The PIB 110 may be configured to attach to the stiffener 105. The PIB 110 may be substantially planar and of any shape (e.g., round, oval, square, rectangular, star-shaped, etc.) The PIB 110 may be larger in area than the test sample 130. Though, specific size is not critical, and in some embodiments the PIB may be smaller in area than the test sample. The PIB 110 may further include electrically conductive or contact features, e.g., pads or extending elements, on at least one surface, e.g., on a first surface facing the tester and on a second surface facing the interposer. Contact features on the second surface may come into contact with contact elements on the interposer 300. The PIB may also include at least one alignment feature (e.g., hole, pin, tab, divot, slot, groove, etc.) for participating in aligning the PIB 110 to the stiffener 105.

The probe interface board 110 may include a plurality of alignment features that participate in the alignment of the PIB with other components in the probe assembly 140 including the interposer. In some implementations, the PIB may include a first plurality of alignment features (e.g., holes or slots for receiving alignment pins 112, protruding alignment tabs, permanently attached alignment pins, divot, slot, groove etc.). Alignment pins 112 may be used to align and/or secure modules of the interposer 300 to the PIB 110 so that conductive contact elements on the interposer align to mating contact features on the PIB 110. Although the drawing in FIG. 1 shows the pins inserted into the PIB 110, in some embodiments, the alignment pins 112 may first be inserted into the interposer modules, which are then subsequently affixed to holes in the PIB 110 using the alignment pins 112.

The interposer 300 may be disposed in the probe assembly 140 between the probe interface board and translator, and configured to convey electrical signals between the probe interface board and translator. The interposer may comprise a plurality of modules that may be aligned and/or secured to the PIB 110 using any suitable alignment features, e.g., aligned using alignment pins 112. Each module of the interposer may include a plurality of conductive members that may be used to connect at least one conducting structure, e.g., a contact pad or tab, on the PIB 110 to at least one conducting structure on the translator 120. The interposer may be substantially planar, and of any shape. In preferred embodiments, the interposer 300 may be round and approximately the size of a semiconductor wafer. The interposer 300 may be configured to be aligned to the translator 120 using mating alignment features. Though, in some embodiments, alignment features used to align interposer 300 to probe interface board 110 also may be used to align translator 120 relative to interposer 300. Further details of the interposer modules are described below in connection with FIGS. 2-3.

The translator 120 may be disposed adjacent the interposer and comprise a plurality of conductive elements that convey signals between the interposer and a devices or circuits distributed on the test sample 130. The translator may include a plurality of electrical traces and contact probes for providing paths between at least one conductive structure on the interposer and at least one test point of one circuit or device on the test sample 130. The translator may be a substantially planar structure, e.g., a printed circuit board. The translator may include alignment features for aligning the translator to the interposer 300 or to the PIB-translator sealing member 115 or to the stiffener 105. The translator may be made using techniques known in the art.

When assembled in a stack, the translator 120, interposer 300, and PIB 110 may be substantially immovable with respect to each other in a lateral direction, e.g., a direction transverse to the direction of stacking (directions lying in the X, Y plane), and may or may not be movable with respect to each other in the direction of stacking (the Z direction). In this regard, the relative motion of any two of the translator 120, interposer 300, and PIB 110 with respect to one another in a lateral direction may be less than about 500 microns in some embodiments, less than about 200 microns in some embodiments, less than about 100 microns in some embodiments, less than about 50 microns in some embodiments, less than about 20 microns in some embodiments, and yet less than about 10 microns in some embodiments. Though, in some embodiments, the individual modules of interposer 300 may be moveable relative to the probe interface board 110 and/or translator 120. Such movement may allow positioning of each module of interposer 300 based on alignment features, such as alignment pins 112. In this way, tight alignment tolerances may be achieved between conductive elements within each interposer module and conductive pads on the PIB 110 and/or translator 120.

In some embodiments, the probe interface board 110, interposer 300, and translator 120 may be held together, at least in part, using pneumatic pressure and/or vacuum and related pneumatic apparatus. As an example, a PIB-translator sealing member 115 may be disposed between the PIB 110 and translator 120 to form a pneumatic chamber in which the interposer 300 may be disposed. The sealing member 115 may comprise a ring structure having at least one gasket, seal, or O-ring forming an air-tight seal between the PIB 110 and translator 120. The sealing member 115 may be of approximately the same thickness as the interposer 300. Evacuation of air in the pneumatic chamber formed by the sealing member 115 may draw the translator 120 and/or PIB 110 into contact with the interposer 300.

In some embodiments, the probe interface board 110, interposer 300, and translator 120 may be held together by mechanical fasteners, e.g., friction fit alignment pins, spring pins, camming structure, clips, screws, rivets, etc., or a combination of different types of mechanical fasteners. In this regard, the interposer 300 may include fastener retaining features to accommodate the fasteners.

A translator-wafer sealing member 125 may be used in some implementations to form a second pneumatic chamber between the test sample 130 and translator 120. The second pneumatic chamber may be evacuated to pull at least a portion of the test sample into contact with the translator.

In some embodiments, the probe interface board 110, interposer 300, and translator 120 as an assembly may be pressed into contact with the test sample 130 using mechanical means, e.g., micropositioning apparatus. In such embodiments, the translator-wafer sealing member 125 may or may not be used.

Figure 2A:
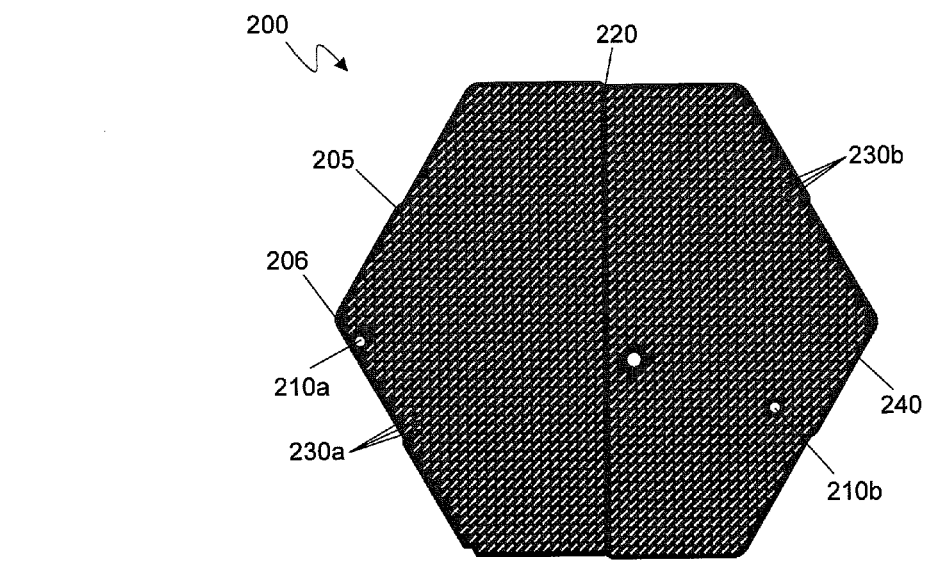
FIG. 2A depicts a plan view of a module for an interposer according to one embodiment.
Figure 2B:
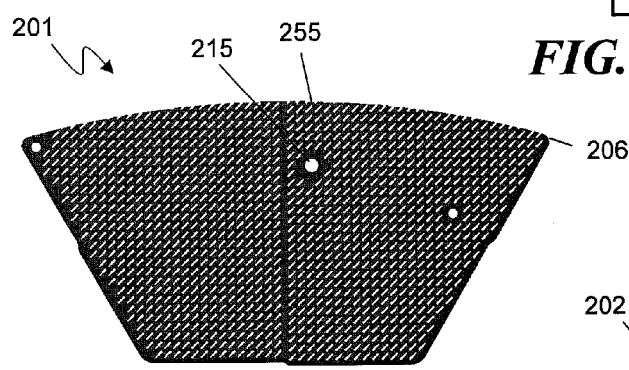
FIGS. 2B and 2C depict plan views of portions of the module of FIG. 2A. The portions 255 and 265 may be obtained by machining the module of FIG. 2A.
Figure 2C:
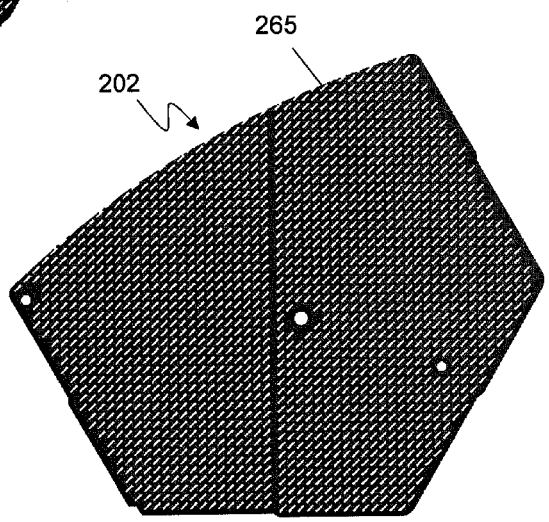
Figure 2D:
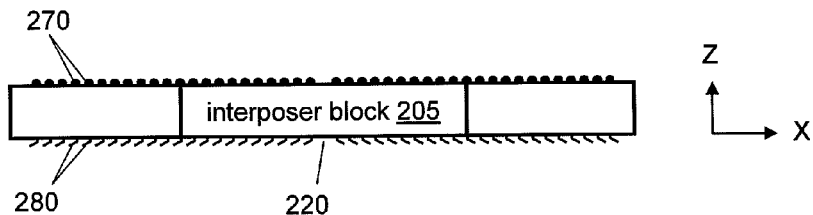
FIG. 2D depicts an elevation view of a module for an interposer according to one embodiment.

As noted above, the interposer 300 may be assembled from a limited number of types of modules sharing a common base shape. Types of interposer modules 200, 201, 202 are depicted in FIGS. 2A-2D, according to one embodiment of the invention. FIGS. 2A-2C depict plan views of the modules, and FIG. 2D depicts an elevation view of a module. As can be seen in FIGS. 2A-2C each module comprises at least a portion of a base module shape shown in FIG. 2A. In the illustrated embodiment, the base shape is a hexagon, although the invention is not limited in this regard.

The inventors have conceived of selecting a base module shape that can be machined into a limited number of shapes and assembled to substantially conform to a desired size and shape of a selected interposer, e.g., a circular interposer about the size of a semiconductor wafer. In one embodiment, a base shape is chosen such that when first modules of the base shape are machined into second modules comprising a first portion of the base shape (first module 201) and third modules comprising a second portion of the base shape (second module 202), the first base shape modules, second and third modules may be the only module shapes used to assemble an interposer into a circle, as can be understood in reference to FIG. 3. Accordingly, if the base module is formed by injection molding, only one injection mold needs to be fabricated to make all of the types of modules. In this regard, a plurality of base modules 200 can be molded from a single mold. Subsequently, a first portion of the plurality of base modules 200 can be machined into a first module 201 and a second portion of the plurality of base modules 200 can be machined into a second module 202. The base modules 200, first modules 201, and second modules 202 may then be assembled into the selected shape.

Figure 3A:
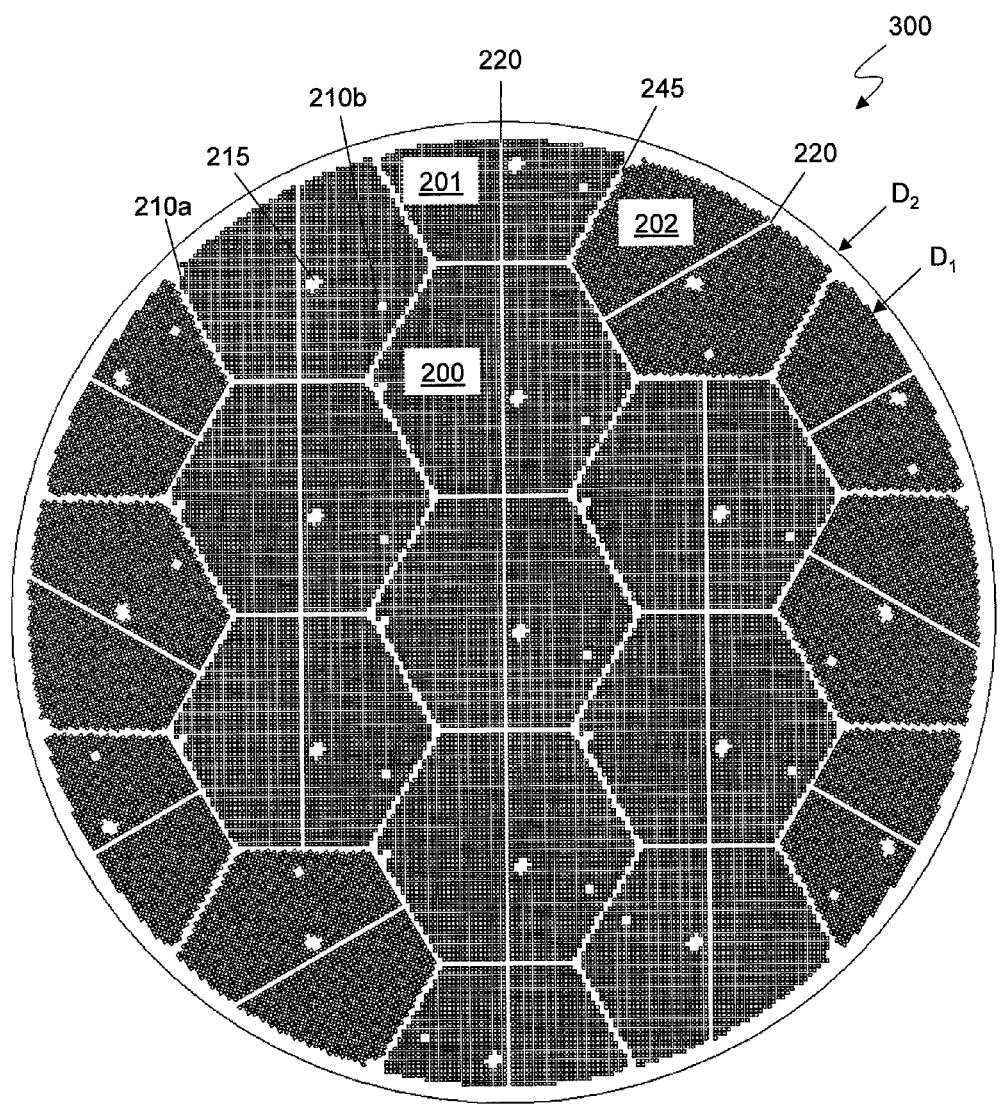
FIG. 3A is a plan view illustrating an assembly of modules into an interposer according to one embodiment.
Figure 3B:
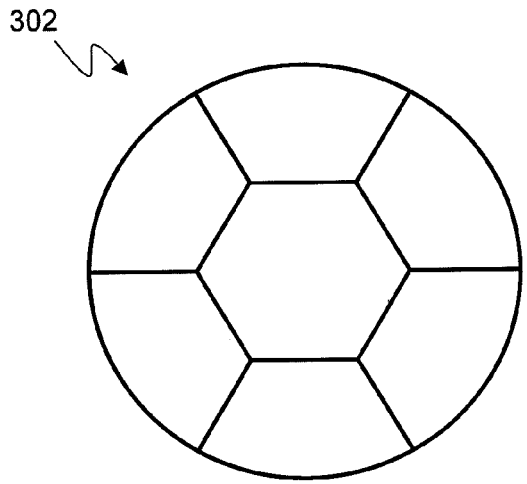
FIG. 3B is a plan view illustrating an assembly of modules into an interposer according to one embodiment in which only two module shapes are used to fill a circle.

Additionally, the assembled modules, as can be seen in reference to FIG. 3A, may substantially fill the selected shape, e.g., substantially fill the circle. This may be useful, for example, to fill the area of a test sample 130 such as a semiconductor wafer over which integrated circuits and devices may be distributed. FIG. 3B depicts an embodiment in which only two module shapes may be used to form an interposer in a shape of a circle.

When used to fill a circular or oval area, at least one of the modules 201, 202 may include an arcuate edge 255, 265. The arcuate edge may substantially span between two apexes of the base module shape. The arcuate edge may comprise approximately an arc segment of the circle or oval to be substantially filled with an assembly of base modules and module portions.

A base module may be first formed in a shape that may differ from and/or be larger than a final base module shape 200. For example, a module may be first formed in a large size (e.g., additional material around at least a portion of the perimeter), and machined to a final base module shape. Machining all base modules may provide better size tolerances than may be achieved from a forming process, e.g., tighter size tolerances than possible with injection-molding alone. Machining the base module may also smooth the sides of the base modules so as to remove artifacts of the molding process caused by injection molding gates. Accordingly, machining of the base module may also allow for a distribution of injection-molding gates that provide better uniformity of polymer throughout the module. Since the injection molded modules may require some machining, e.g., to meet size tolerances and/or remove artifacts, there is little additional cost in machining modules into pieces 201, 202 that comprise portions of the base shape.

The machining of the edges of the module to remove artifacts associated with injection molding gates also beneficially reduces the distance from the edge of the module to a conductive structure 270, 280. This reduction in distance reduces the area at the borders of modules that is unusable for probing underlying devices. The machining of the edges of a module may reduce the distance between the module's edge and conductive structure to a value less than about 3 mm in some embodiments, less than about 2 mm in some embodiments, and less than about 1 mm in some embodiments. An edge of a module may include at least one stepped portion 240.

In overview, the base module 200 may comprise a block 205 of electrically insulating material (e.g., an injection-molded polymer or composite, a machined polymer or composite) formed in a selected shape. The base module may include a plurality of apexes 206 and a plurality of alignment features 210a, 210b. The module 200 may further include a plurality of conductive elements (not shown) that pass through the block providing electrical connectivity between conductive structures 270 on a first surface and conductive structures 280 on a second surface of the module. The module 200 may further include at least one fastener retaining feature 215 at a common location on each piece that may be used to retain each piece to a structure, e.g., to the PIB 110. Any type of mechanical fastener, e.g., any of the types described above, may be used to retain each module to an adjacent or nearby structure.

In some embodiments, the module may comprise a plurality of features 230a, 230b (e.g., holes, cavities, or slots) distributed across the module, and at least one "street" 220 running between cavities. Conductive elements may pass through the cavities 230a, 230b and connect to conductive structures 270, 280 on opposing sides of the interposer, as seen in FIG. 2D. The conductive elements and conductive structures may be affixed in cavities of a module 200 after the module has been injection molded. In other implementations, the conductive elements and conductive structures may be positioned and held, and the module 200 molded around the conductive elements and conductive structures. In yet other embodiments, the conductive structures 270, 280 may be pressed into the features 230a, 230b.

The alignment features 210a, 210b may be used to register each module 200, 201, 202 to an adjacent structure, such as the PIB 110, or a nonadjacent structure so as to align and/or hold each module in the probe assembly 140. The alignment features may comprise holes into which alignment pins may be inserted, and may also include holes used for retaining devices, e.g., screw holes 215. There may be one, two, three, or more alignment features on each module. In some embodiments, the alignment features are located such that the alignment features are present on each base module 200 and each portion 201, 202 of the base module in common arrangements and locations, as depicted in FIGS. 2A-2C. In this regard, the location of the alignment features are not limited to locations shown in the drawings. For example, two alignment features may be located near any two of the four apexes 206 shown in FIG. 2B. There may be mating alignment features on an adjacent structure, e.g., the PIB and/or translator, as well as other structures such as the stiffener. In some embodiments, the alignment features may comprise detents and/or tab-like or pin-like structures that have mating features on an adjacent structure (PIB 110) or non adjacent structure (stiffener 105).

The incorporation of alignment features that are common to each module 200, 201, 202 provides for use of a single fixture and machine to insert the conductive structures 270, 280 during manufacture of the modules. The common alignment features also provide for use of a single electrical test fixture and apparatus to electrically test each module.

At least one street 220 may be disposed on the base module 200. A street may comprise a path or channel along a surface of the module in which there are no cavities 230a, 230b or contacts 270, 280. A street may have a width wider than the periodic spacing between contacts, as depicted in the drawing. A street may correspond to a similar region on the PIB 110 that is used for routing signals to or from a plurality of contact features on the PIB that align to and contact with contacts 270 on an interposer module. For example, a street may correspond to a region on the PIB containing a plurality of traces.

In some implementations, a street 220 may be used on a module to route electrical traces to and from conductive elements within a module 200, 201, 202. In this regard, a signal arriving at one of the plurality of contacts 270 or 280 may be distributed to a plurality of other contacts within the module. In some embodiments, a region along the perimeter of a module or module portion may accommodate traces for routing signals.

Where an interposer pin 112 causes an X- or Y-directed force on the PIB 110 and/or translator 120, contacts 280 on each side of the street can be oriented 180 degrees with respect to each other to negate or significantly reduce any force to the structure or alignment pins. Thus, orientation of the contacts 280 may be used to reduce in-plane forces within the interposer structure.

Conductive structures 270, 280 (shown in FIG. 2D) may or may not couple to mating conductive elements on an adjacent component (e.g., the translator or PIB) when the PIB, interposer, and translator are assembled into a probe assembly stack. The contacts 270, 280 may be any suitable electrically-conductive material. In some embodiments, the contacts may couple to conductive members (not shown) within the interposer that convey electrical signals (digital and/or analog) through the interposer module. In some embodiments, each contact 270, 280 may comprise opposing ends of a same conductive element, e.g., a conductor or wire bent into a selected shape. The conductive members may be disposed in cavities 230a, 230b distributed across the module 200.

Conductive structures 280 on a first surface of an interposer module may differ or may be the same as conductive structures 270 on a second surface of the interposer. In one embodiment, conductive structures 280 on a first surface may comprise wire-shaped or tab-shaped elements extending from the first surface. Conductive structures 270 on a second surface may comprise bumps, though the invention is not limited in this regard. The conductive structures 270 may comprise contact pads or tabs in some embodiments.

In some implementations, conductive structures 280 may comprise a metal, alloy, or any suitable conductive material. The conductive structures may be springy or compliant. When brought into contact with an adjacent structure, the interposer may impart X- and/or Y-directed scrub forces to the ends of the contacts 270 so that the contacts break through native oxides or debris at the area in which they contact. The conductive structures 280 may comprise a material that is corrosion resistant, or include a conductive coating that is corrosion resistant. The conductive structures may include a soft non-corrosive coating (e.g., gold), so that repeated acts of contacting pads on the translator 120 to conductive structures 280 does not appreciably degrade the contact pads. The density of conductive structures may be high, e.g., on a spacing between about 2 mm and about 1 mm, between about 1 mm and about 0.5 mm, and yet between about 0.5 mm and about 0.2 mm in some embodiments.

In some implementations, various conductive structures 280 on a first surface may extend from the first surface in at least two lateral directions, as depicted in FIG. 2D. The phrase "extend from a surface in a lateral direction" refers to an extension from a surface, wherein the extension has at least one directional component parallel to the surface. The extension may further include a component normal to the surface. In this regard, a first portion of the contacts 280 may extend in a first lateral direction, and a second portion extend in a second lateral direction. The extension of contacts 280 from a surface in at least two lateral directions can reduce or cancel lateral forces on the interposer module that would tend to move or misalign the module when the contacts 280 are under compression.

Cancellation of lateral forces exerted by the plurality of conductive structures may be more clearly understood in reference to FIG. 2D. When compressed, conductive structures 280 on the left (−X) portion of the module 200 may exert −X and +Z directed forces on the interposer block 205. Conductive structures 280 on the right (+X) portion of the module 200 may exert +X and +Z directed forces on the interposer block 205. If there are the same number of contacts on the left and right portions, the lateral (X) force components will cancel. The cancellation of lateral forces can reduce or eliminate a tendency for misalignment of the interposer modules 200, 201, 202 or interposer 300 with respect to the PIB or translator due to compression of the contacts 280 and/or 270.

As depicted in FIG. 2D, the conductive structures 280 for a first portion (left half in the drawing) of the module 200 may extend from a surface of the module in a first lateral direction that is different from a second lateral direction for conductive structures 280 of a second portion (right half) of the module. In some embodiments, the cavities 230a, 230b may be shaped (e.g., wedge-shaped) to cause or accommodate extension of contacts 280 in a selected direction.

The at least two lateral directions in which conductive structures extend may be opposite or may not be opposite. In some embodiments, there may be a plurality of areal portions of conductive structures on the module 200, wherein at least conductive structures 280 within a first areal portion extend from a surface of the module in a lateral direction different from conductive structures 280 within a second areal portion. The plurality of portions of the conductive structures may be oriented so as to substantially cancel lateral forces exerted by the plurality of conductive structures on the interposer module 200 or assembled interposer 300 when the plurality of conductive structures are compressed. The conductive structures 280 may be compressed when an interposer 300 is assembled into the probe assembly 140 and placed in contact with the translator 120. In some implementations, the directions of lateral extension of contacts 280 may be varied or altered from contact to contact rather than from area to area.

Since circuit and device density can be high on a semiconductor wafer, there may be a large number of contacts 280 on the interposer. In some embodiments, for testing a 300-mm-diameter semiconductor wafer, between about 5,000 and about 10,000 contacts in some embodiments, between about 10,000 and about 20,000 contacts in some embodiments, between about 20,000 and about 40,000 contacts in some embodiments, and yet between about 40,000 and about 80,000 contacts in some embodiments may be required. At high contact densities, a high accuracy may be required in the locating of each conductive structure 280. For example, contact 280 locations may be accurate to within about ±200 microns in some embodiments, about ±100 microns in some embodiments, and in some embodiments within about ±50 microns relative to the alignment features 210a, 210b.

Alignment tolerances between contacts 280 and mating contact pads or tabs on the translator 120 can be tight, since the density of contacts 280 may be high and mating contact pads may be small. In this regard, interposer-to-translator alignment tolerances may be less than about ±200 microns, less than about ±100 microns, and in some embodiments less than about ±50 microns. In some embodiments, a material may be chosen for the blocks 205 such that the coefficient of thermal expansion (CTE) for the interposer blocks is approximately the same as the CTE for the translator 120. A matching of CTE's for the interposer blocks and translator can reduce thermally-induced misalignment between the interposer contacts 280 and contact pads or tabs on the translator.

Since there may be a large number of conductive structures 280 on an assembled interposer 300, the spring force for each contact may be constrained by a maximum available force that may be applied to the interposer or translator. For example, a total of 32,500 conductive structures 280, each requiring about 12 grams of compressive force will, in total, require about 390 kg of compressive force for the assembled interposer. Spring forces for the conductive structures 280 may be between about 1 g and about 5 g, between about 5 g and about 10 g, between about 10 g and about 20 g in some embodiments, and yet between about 20 g and about 50 g in some embodiments. The lifetime of the springy conductive structures is greater than 10,000 cycles in some embodiments, greater than 20,000 cycles in some embodiments, greater than 50,000 cycles in some embodiments, and yet greater than 100,000 cycles in some embodiments.

Modules assembled into an interposer are depicted in FIG. 3A according to one embodiment. As shown in FIG. 3A, an assembled interposer 300 may comprise 19 modules of three shapes manufactured from a common base shape, however the invention is not limited in this regard. There may be more or less modules. For example, FIG. 3B depicts one embodiment in which there are 7 modules of two shapes. In some embodiments, four or five shapes may be used that are manufactured from a common base shape.

The size of an assembled interposer may be smaller than, approximately the same size as, or larger than a test area on a test sample 130. As can be seen in FIG. 3A, the assembled modules substantially fill a selected shape. The selected shape may be a circle circumscribing the assembled modules or interposer. The circle may have a diameter ($D_1$ or $D_2$) approximately equal to a semiconductor wafer in some embodiments. In one embodiment, the circle may have a diameter $D_1$ of about 290 mm wherein the semiconductor wafer may have a diameter $D_2$ of about 300 mm. Accordingly, the modules may be used in an interposer for full-wafer testing.

In some embodiments, the selected shape of an interposer may be a circle having a diameter $D_1$ approximately equal to a diameter of an area on a semiconductor wafer that contains all circuits and devices fabricated on the wafer. In this regard and in reference to FIG. 2 and FIG. 3A, the assembled interposer 300 may provide conductive structures 280 to outer most regions of the wafer where circuits and/or devices may be located. Additionally, an annular region (between $D_1$ and $D_2$) may be provided at the periphery of the interposer that accepts at least a portion of mounting hardware (e.g., the PIB-translator sealing member 115) that circumscribes the interposer modules.

In further reference to FIGS. 2A-2C and FIG. 3A, it will be appreciated that there may be little wasted area along the periphery of the interposer at locations 245 where the apexes 206 of the module portions 201, 202 abut. For example, for a selected circular area (e.g., a circle having a fixed diameter $D_1$ that may correspond to the size of a semiconductor wafer), triangular voids would open around the periphery of the interposer between abutting module portions of the modules as the module size is reduced. In some embodiments, the assembled modules fill between about 80% and about 100% of a selected area, between about 90% and about 100% of a selected area in some embodiments, between about 95% and about 100% of a selected area in some embodiments, between about 97% and about 100% of a selected area in some embodiments, and yet between about 99% and about 100% of a selected area in some embodiments. It will be appreciated that the plurality of conductive structures 270, 280 may fill approximately the same amount of area as the modules.

The streets 220 on an assembled interposer may align from module to module, as can be seen in FIG. 3A. A printed circuit board or other substrate to which interposer 300 is attached will have a corresponding pattern of conductive structures, such as pads to which contacts 270 and/or 280 will mate. Accordingly, the streets in interposer 300 will correspond to streets in those printed circuit boards, which can be used as routing channels. Electrical access to interior modules may be achieved along the streets if desired. In this regard, electrical access to all modules using the routing channels corresponding to streets 220 may be obtained from the perimeter of the assembled interposer.

It may also be appreciated in reference to FIG. 3A and FIG. 2D that net lateral forces on the assembled interposer 300 due to compression of the contacts 280 may substantially cancel in the configuration shown in FIG. 3A. Substantial cancellation of lateral forces can be appreciated in view of the symmetry of module distribution about the center of the circular area.

Having described embodiments of modules for interposers, related methods will now be described.

Figure 4:
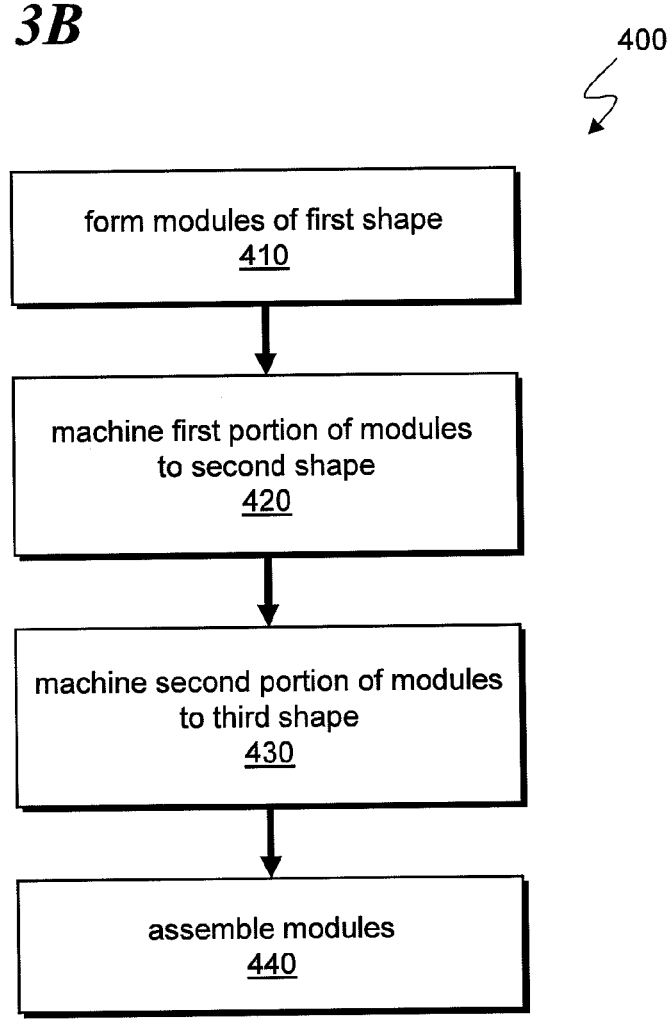
FIG. 4 is a flow diagram of acts for fabricating an interposer according to one embodiment.

One embodiment of a method 400 for fabricating an interposer is illustrated in the flow diagram of FIG. 4. The method 400 may comprise acts of forming 410 modules of a first shape, machining 420 a first portion of the formed modules to a second shape, machining 430 a second portion of the formed modules to a third shape, aligning 440 and assembling 450 the modules into an interposer of a selected shape. Additional acts relating to fabrication of modules and assembly may be included. Some of the acts may be executed manually or in an automated or semi-automated manner with a programmable or computer-controlled machine.

The act of forming 410 modules of a first shape may comprise forming a plurality of base modules of a single selected shape by a machine process, such as injection molding, CNC milling, hot pressing, punching, laser cutting, or a combination thereof. The single selected shape may be a hexagon. The act of forming 410 may further comprise forming at least one or at least two alignment features in each module. In some embodiments, the act of forming 410 may further comprise forming a plurality of contact retaining features (e.g., cavities or vias) in each module. Contact retaining features may comprise any type and form of feature adapted to retain conductive structures 270, 280 and/or corresponding conductive elements passing through the module. Acts of forming alignment features and contact retaining features may be part of the machine process of forming modules of a single selected shape, or may be separate acts performed after the act of forming 410 modules of a first shape. In some embodiments, the act of forming 410 modules of a first shape may further comprise affixing a plurality of flexible conductive structures into a plurality of contact retaining features in the modules.

The act of forming 410 modules may include selecting a limited number (e.g., two, three, or four) of shapes that may be derived from a single shape to substantially fill a selected area when assembled. The selecting of shapes may comprise selecting shapes to fill a circle approximately the size of a semiconductor wafer.

The act of forming 410 modules may include machining each base module to remove material along at least a portion of the periphery of the module. The material may be removed for purposes of achieving size tolerances. In some implementations, the material may be removed to reduce "dead zones" having no contacts near abutting edges of modules. The reduction of dead zones can increase contact density at the periphery of modules.

The act of machining 420 a first portion of the modules to modules of a second shape may comprise removing a portion of a base-shape module. The act of machining 420 may comprise removing a portion by milling, grinding, cutting, or any suitable machining process or combination of machining processes. In some embodiments, the removal of a portion of a base module produces a first arc 255 on a module of the second shape. The first arc may be adapted to span a first segment of a perimeter of a selected interposer shape (e.g., a segment of a perimeter of a circle, oval, or polygon). The act of machining 420 may produce a first arc that spans approximately between two apexes of the base-shaped module.

The act of machining 430 a second portion of the modules to modules of a third shape may comprise removing a portion of a base-shape module. The act of machining 430 may comprise removing a portion by milling, grinding, cutting, or any suitable machining process or combination of machining processes. In some embodiments, the removal of a portion of a base-shape module produces a second arc 265 on a module of the third shape. The second arc may be adapted to span a second segment of a perimeter of the selected interposer shape. The act of machining 430 may produce a second arc that spans approximately between two apexes of the base-shaped module.

In forming an arc 255, 265 on a module, the arc may pass through a cavity 230a, 230b leaving a sharp or jagged edge. Subsequent milling may be done to remove the jagged and sharp features from each cavity so that the resulting arc has a stair-case shape at least in some regions of the arc.

The method 400 of fabricating an interposer may include an act of assembling 440 the interposer modules into an interposer or a probe assembly 140 or other structure that may be used as part of an interface between a tester 102 and test sample 130. In some embodiments, the act of assembling may comprise fastening each module into an interposer assembly or probe assembly (e.g., using friction pins, spring pins, screws, rivets, nuts and bolts, glue, adhesive film, or any combination thereof) such that, once fastened, the interposer modules are substantially immovable with respect to each other in a lateral direction (i.e., in a direction lying in the plane of the assembled modules) or in some embodiments, may move in a lateral direction such that positioning of each module is independently controlled based on alignment features.

The act of assembling 440 may further comprise an act of aligning that may or may not be carried out at substantially the same time as the assembling. For example, each module may be individually aligned to a selected location and fastened in a sequential manner, or all (or a group of) modules may first be aligned and then fastened. The act of aligning 440 may comprise registering each module to a location in an assembly of modules using, at least in part, alignment features on each module. As an example, the act of aligning may comprise registering each module to a location using one or more alignment pins 112.

CONCLUSION

The section headings used herein are for organizational purposes only and are not to be construed as limiting the subject matter described in any way.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

In this respect, various aspects of the invention, e.g., designing, machining, aligning, and assembling of the modules, may be embodied at least in part using computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media can be transportable, such that the program or programs stored thereon can be loaded onto one or more different computers or other processors to implement various aspects of the present technology as discussed above.

The terms "program" or "software" are used herein in a generic sense to refer to any type of computer code or set of computer-executable instructions that can be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

Terms of degree, "about," "approximately," "substantially," may be used throughout the specification. Such terms of degree may refer to values that are within a selected percentage of or equal to an identified value, e.g., within 30%, within 20%, within 10%, within 5%, within 2%, within 1%, and yet within 0.5% of or equal to an identified value in some embodiments.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. An interposer comprising a plurality of modules, each of the modules comprising a plurality of flexible conductive structures extending from a first surface, wherein the plurality of modules comprise at least one first module formed in a first shape and at least one second module formed in a second shape that is a first portion of the first shape and less than an entirety of the first shape, and wherein the plurality of modules, when assembled into the interposer, fill more than 70% of a circle circumscribing the interposer.

2. The interposer of claim 1, wherein the first shape is a hexagon.

3. The interposer of claim 1, wherein each module of the first shape is formed using at least a fabrication step of injection molding or machining.

4. The interposer of claim 1, wherein each module of the at least one second module comprises a block that is machined from a block of the first shape.

5. The interposer of claim 1, wherein the each module of the plurality of modules includes at least one alignment feature for aligning each module in the assembled interposer.

6. The interposer of claim 5, wherein the each module of the plurality of modules includes at least one retaining hole for a fastener to secure the module to another structure.

7. The interposer of claim 5, wherein the alignment feature comprises an element selected from the following group: hole, pin, tab, detent, notch, slot, screw, and screw retaining hole.

8. The interposer of claim 1, wherein the circle is approximately the size of a semiconductor wafer used for fabricating microelectronic devices.

9. The interposer of claim 8, wherein the flexible conductive structures extend from a first surface of the each module of the plurality of modules in at least two lateral directions so as to substantially cancel lateral forces exerted by the plurality of conductive structures on the each module or the assembled interposer when the plurality of conductive structures are compressed.

10. The interposer of claim 9, further comprising:
a translator coupled to a first side of the interposer; and
a probe card coupled to a second side of the interposer.

11. A plurality of interposer blocks for fabricating an interposer, each interposer block configured to receive a plurality of flexible conductive structures, wherein at least one first interposer block is in the shape of a selected polygon having more than four sides and at least one second interposer block is in a shape comprising a portion of the selected polygon that is less than an entirety of the selected polygon, and wherein the at least one second interposer block is formed from a first interposer block.

12. The plurality of interposer blocks as claimed in claim 11, wherein each block is injection molded from an injection mold of a single shape.

13. The plurality of interposer blocks as claimed in claim 11, wherein each block in the shape of a portion of the selected polygon is machined from a block in the shape of the selected polygon.

14. The plurality of interposer blocks as claimed in claim 11, wherein the plurality of interposer blocks each include at least one alignment feature for aligning each interposer block into a fixture to form an assembled interposer of a selected shape and wherein the assembled interposer fills more than 70% of a circle circumscribing the selected shape.

15. The plurality of interposer blocks as claimed in claim 14, wherein the plurality of interposer blocks each include at least one retaining hole for a fastener to secure each block to another structure.

16. The plurality of interposer blocks as claimed in claim 14, wherein the alignment feature comprises an element selected from the following group: hole, pin, tab, detent, notch, slot, screw, and screw retaining hole.

17. The plurality of interposer blocks as claimed in claim 14, wherein the assembled interposer fills at least 90 percent of an area of the circle.

18. The plurality of interposer blocks as claimed in claim 11, wherein
interposer blocks in the shape of the selected polygon comprise a first plurality of injection-molded blocks of a first design; and
interposer blocks in the shape of the portion of the selected polygon comprise a second plurality of injection-molded blocks of the first design with at least a first shape portion removed from some of the second plurality of injection-molded blocks.

19. The plurality of interposer blocks as claimed in claim 11, wherein interposer blocks in the shape of a portion of the selected polygon include an arcuate edge substantially spanning two apexes of the polygon.

20. The plurality of interposer blocks as claimed in claim 11, wherein the plurality of interposer blocks comprise at most three shapes.

21. The plurality of interposer blocks as claimed in claim 11, wherein each interposer block of the plurality of interposer blocks further comprises:
at least one feature for aligning the interposer blocks in an interposer assembly;
at least one retaining hole for a fastener;
a plurality of cavities; and
the flexible conductive structures extending from the plurality of cavities on a first surface of the each interposer block.

22. An interposer block comprising:
a hexagonally-shaped element comprising a first surface, a second surface, and six edge surfaces;
at least one alignment feature near a first apex of the hexagonally-shaped element for aligning the element into a fixture to form an interposer comprising a plurality of the hexagonally-shaped elements; and
a plurality of flexible conductive structures distributed across the hexagonally-shaped element.

23. The interposer block of claim 22, further comprising a street running centrally across the hexagonally-shaped element, the street providing an area to route electrical signals to at least some of the conductive structures.

24. The interposer block of claim 22, wherein the conductive structures flexibly extend from the first surface of the hexagonally-shaped element in at least two lateral directions.

25. A method for fabricating an interposer, the method comprising:
forming a plurality of modules of a first shape; and
machining a portion of the plurality of modules into not more than a second shape and a third shape, wherein the second shape and third shape are each portions of the first shape and less than an entirety of the first shape, and wherein the first shape, second shape, and optionally third shape are selected such that modules of the first, second, and optionally third shapes are configured to be assembled to fill more than 70% of a circle circumscribing the assembled modules.

26. The method of claim 25, further comprising
assembling modules of the first shape, second shape, and optionally third shape into an interposer.

27. The method of claim 25, wherein the forming comprises injection molding the plurality of modules of the first shape using an injection mold of a first design.

28. The method of claim 25, wherein the first shape is a hexagon.

29. The method of claim 25, wherein the machining comprises removing at least a first portion of the first shape from each module of the first portion of the plurality of modules.

30. The method of claim 25, wherein the machining produces at least a first arc that spans a first segment of a perimeter of a circle.

31. The method of claim 30, wherein the first shape is a hexagon and the at least a first arc spans two apexes of the hexagon.

32. The method of claim 25, further comprising:
forming at least one alignment feature in each module of the plurality of modules of a first shape;
forming a plurality of cavities in each module of the plurality of modules of a first shape, each cavity configured to hold a flexible conductive structure in a preferred orientation; and
assembling modules of the first shape, second shape, and optionally third shape into an interposer.

33. The method of claim 32, wherein the assembling comprises aligning the modules of the first shape, second shape, and optionally third shape using alignment pins inserted into the at least one alignment feature.

34. The method of claim 32, further comprising affixing a plurality of flexible conductive structures into the plurality of cavities.

35. The method of claim 34, wherein the flexible conductive structures are affixed into the plurality of cavities to extend in at least two lateral directions from a same surface of each module so as to substantially cancel lateral forces exerted by the plurality of conductive structures on each module or the interposer when the plurality of conductive structures are compressed.

* * * * *